US010662520B2

(12) United States Patent
West (10) Patent No.: US 10,662,520 B2
(45) Date of Patent: May 26, 2020

(54) METHOD FOR RECYCLING SUBSTRATE PROCESS COMPONENTS

(71) Applicant: Applied Materials, Inc., Santa Clara, CA (US)

(72) Inventor: Brian T. West, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 304 days.

(21) Appl. No.: 15/473,093

(22) Filed: Mar. 29, 2017

(65) Prior Publication Data

US 2018/0281027 A1    Oct. 4, 2018

(51) Int. Cl.
| | | |
|---|---|---|
| *C23C 16/44* | (2006.01) | |
| *C23C 14/22* | (2006.01) | |
| *C23C 14/56* | (2006.01) | |
| *B08B 3/12* | (2006.01) | |
| *B24C 1/08* | (2006.01) | |

(Continued)

(52) U.S. Cl.
CPC .............. *C23C 14/22* (2013.01); *B08B 3/12* (2013.01); *B24C 1/08* (2013.01); *C23C 14/564* (2013.01); *C23C 16/4407* (2013.01); *B08B 1/005* (2013.01); *B24C 1/06* (2013.01)

(58) Field of Classification Search
CPC .................................................. C23C 14/588
See application file for complete search history.

(56) References Cited

U.S. PATENT DOCUMENTS

| | | | | |
|---|---|---|---|---|
| 3,654,153 A | * | 4/1972 | Pogorely | .............. C10M 173/02 |
| | | | | 508/175 |
| 3,842,545 A | * | 10/1974 | Possati | ................... B23Q 15/02 |
| | | | | 451/25 |
| 5,471,900 A | | 12/1995 | Corwin et al. | |

(Continued)

FOREIGN PATENT DOCUMENTS

| | | |
|---|---|---|
| JP | 2011-018894 A | 1/2011 |
| KR | 10-2013-0134029 | 12/2013 |
| WO | 2016153343 A1 | 9/2016 |

OTHER PUBLICATIONS

PCT/US2018/019329, International Search Report, dated Jun. 8, 2013, 3 pages.

*Primary Examiner* — Dah-Wei D. Yuan
*Assistant Examiner* — Nga Leung V Law
(74) *Attorney, Agent, or Firm* — Patterson + Sheridan, LLP (57) ABSTRACT

A method for recycling a substrate process component of a processing chamber is provided. In one example, the recycling process includes retrieving a reference dimension for the substrate process component. The substrate process component includes a side wall having a bottom surface, an outer surface, a pre-defined wall thickness between the bottom surface and the outer surface, and a residue layer. The reference dimension corresponds to the pre-defined wall thickness. The recycling process includes machining the substrate process component with a mechanical cutting tool. The machining includes securing the substrate process component to a work piece holder and passing the mechanical cutting tool across the outer surface in a machining operation controlled by a controller to remove the residue layer. The controller uses the reference dimension to control the machining operation so that the substrate process component (Continued)

has the reference dimension after removal of the residue layer.

17 Claims, 4 Drawing Sheets

(51) Int. Cl.
*B08B 1/00* (2006.01)
*B24C 1/06* (2006.01)

(56) References Cited

U.S. PATENT DOCUMENTS

| | | | |
|---|---|---|---|
| 5,578,164 A * | 11/1996 | Kurono | H01J 37/32623 |
| | | | 134/1.2 |
| 6,079,090 A | 6/2000 | Ongaro | |
| 6,699,375 B1 | 3/2004 | Crocker | |
| 7,222,422 B2 | 5/2007 | Gupta et al. | |
| 9,097,116 B2 | 8/2015 | Zebec et al. | |
| 2005/0005859 A1 | 1/2005 | Koshiishi et al. | |
| 2006/0110620 A1* | 5/2006 | Lin | C23C 4/02 |
| | | | 428/650 |
| 2007/0102286 A1 | 5/2007 | Scheible et al. | |
| 2008/0178801 A1 | 7/2008 | Pavloff et al. | |
| 2014/0076354 A1 | 3/2014 | West et al. | |
| 2014/0174917 A1 | 6/2014 | Tsukamoto | |
| 2014/0235061 A1 | 8/2014 | Stumpf et al. | |
| 2016/0230558 A1* | 8/2016 | McCall | C23C 28/021 |

* cited by examiner

METHOD FOR RECYCLING SUBSTRATE PROCESS COMPONENTS

BACKGROUND

Field

Embodiments described herein generally relate to recycling substrate process components that have been used in semiconductor processing chambers.

Description of the Related Art

The formation of semiconductor devices often includes using a processing chamber to deposit various layers on a substrate. The layers may be deposited on the substrate using methods such as physical vapor deposition (PVD) and chemical vapor deposition (CVD). Such methods tend to form a residue layer of deposition material not only on the substrate, but also on substrate process components used to protect surfaces of the processing chamber. Residue deposited on the surfaces of the substrate process components may contaminate the substrate. The substrate process components that are used in a common processing chamber may be part of recyclable process kits. The recyclable process kits include substrate process components that can be removed from the processing chamber, cleaned of residue that includes deposition material, and then reused in the processing chamber.

One method of cleaning the residue deposited on the substrate process components is chemical cleaning. Chemical cleaning may include chemical baths used to etch the deposited material from the substrate process components. The chemical cleaning methods may use chemical solutions that remove deposited materials but undesirably have the effect of degrading the surface of substrate process components during each recycling cycle. The degradation of the substrate process components during each chemical cleaning reduces the number of times the substrate process components can be recycled. Thus, the service life of the substrate process components is dependent on the amount of erosion that the substrate process components can withstand during periodic cleaning. In addition, the chemical cleaning process may result in waste materials that are highly toxic and difficult to dispose.

In a chemical cleaning process, the removal of deposition materials that are made from the same or similar materials as the substrate process components can also increase the degradation of the substrate process components. For example, substrate process components made of aluminum materials may be used in a processing chamber that deposits aluminum on the substrate and also on the substrate process components. Because both the aluminum deposits and the substrate process components both include aluminum materials, the chemicals used to remove the aluminum deposits also tend to substantially degrade the substrate process components.

Processing chambers are being used that have a high rate of deposition onto substrates. The high rate of deposition results in a need to remove more thermal energy from the processing region of the processing chambers. To remove the increased thermal energy, substrate process components made of a material having high thermal conductivity may be used. Substrate process components having high thermal conductivity are expensive, and are degraded by chemical cleaning resulting in a shortened service life of the substrate process components.

Therefore, there is a need for an improved recycling method.

SUMMARY

Embodiments of the disclosure describe a method for recycling a substrate process component of a processing chamber. In one example, the recycling process includes retrieving a reference dimension for the substrate process component. The substrate process component includes a side wall having a bottom surface, an outer surface, a pre-defined wall thickness between the bottom surface and the outer surface, and a residue layer. The reference dimension corresponds to the pre-defined wall thickness. The recycling process includes machining the substrate process component with a mechanical cutting tool to remove the residue layer. The machining includes securing the substrate process component to a work piece holder and passing the mechanical cutting tool across the outer surface in a machining operation controlled by a controller to remove the residue layer. The controller uses the reference dimension to control the machining operation so that the substrate process component has the reference dimension after removal of the residue layer.

In another embodiment, the recycling process includes retrieving a first reference dimension for the substrate process component in a first component region. The substrate process component includes a side wall having bottom surface, an outer surface, a first pre-defined wall thickness between the bottom surface and the outer surface in the first component region, and a residue layer disposed above the outer surface. The first reference dimension corresponds to the first pre-defined wall thickness. The recycling process further includes machining the substrate process component with a mechanical cutting tool to remove the residue layer in the first component region from the outer surface. The machining includes securing the substrate process component to a work piece holder and passing the mechanical cutting tool across the outer surface in a machining operation controlled by a controller to remove the residue layer in the first component region. The controller uses the first reference dimension to control the machining operation to remove the residue layer in the first component region. The side wall has the first reference dimension in the first component region after removal of the residue layer.

In another embodiment, the recycle process includes retrieving a first reference dimension for the substrate process component in a first component region. The substrate process component includes a side wall having a bottom surface, an outer surface, a first pre-defined wall thickness between the bottom surface and the outer surface in the first component region, and a first residue layer disposed above the outer surface. The first reference dimension corresponds to the first pre-defined wall thickness. The recycling process includes determining a compensation factor for the side wall corresponding to a decrease in the side wall during a recycling process of the substrate process component. The recycling process includes machining the substrate process component with a mechanical cutting tool to remove the first residue layer from the outer surface in a recycle operation. Machining includes securing the substrate process component to a work piece holder, and passing the mechanical cutting tool across the outer surface in a machining operation controlled by a controller. The controller uses the first reference dimension with the compensation factor in controlling the machining operation to remove the first residue layer in the first component region. The side wall has the first reference dimension in the first component region after removal of the first residue layer.

BRIEF DESCRIPTION OF THE DRAWINGS

So that the manner in which the above recited features of the present disclosure can be understood in detail, a more particular description of the disclosure, briefly summarized above, may be had by reference to implementations, some of which are illustrated in the appended drawings. It is to be noted, however, that the appended drawings illustrate only selected implementations of this disclosure and are therefore not to be considered limiting of its scope, for the disclosure may admit to other equally effective implementations.

To facilitate understanding, identical reference numerals have been used, wherever possible, to designate identical elements that are common to the Figures. Additionally, elements of one implementation may be advantageously adapted for utilization in other implementations described herein.

DETAILED DESCRIPTION

Embodiments herein generally provide recycling of a substrate process component that has been used in a deposition process, such as in a CVD or PVD processing chamber. Use of the substrate process component in the processing chamber often results in deposition of a residue layer on an outer surface of the substrate process component. Embodiments are disclosed that describe a recycling process that includes machining the substrate process component with a mechanical cutting tool to remove the residue layer. The substrate process component being machined has at least one reference dimension that corresponds to a pre-defined wall thickness. A controller uses the at least one reference dimension during the machining of the substrate process component to remove the residue layer from an outer surface of the substrate process component. Machining removes the residue layer from the outer surface while maintaining the at least one reference dimension of the substrate process component.

Figure 1:
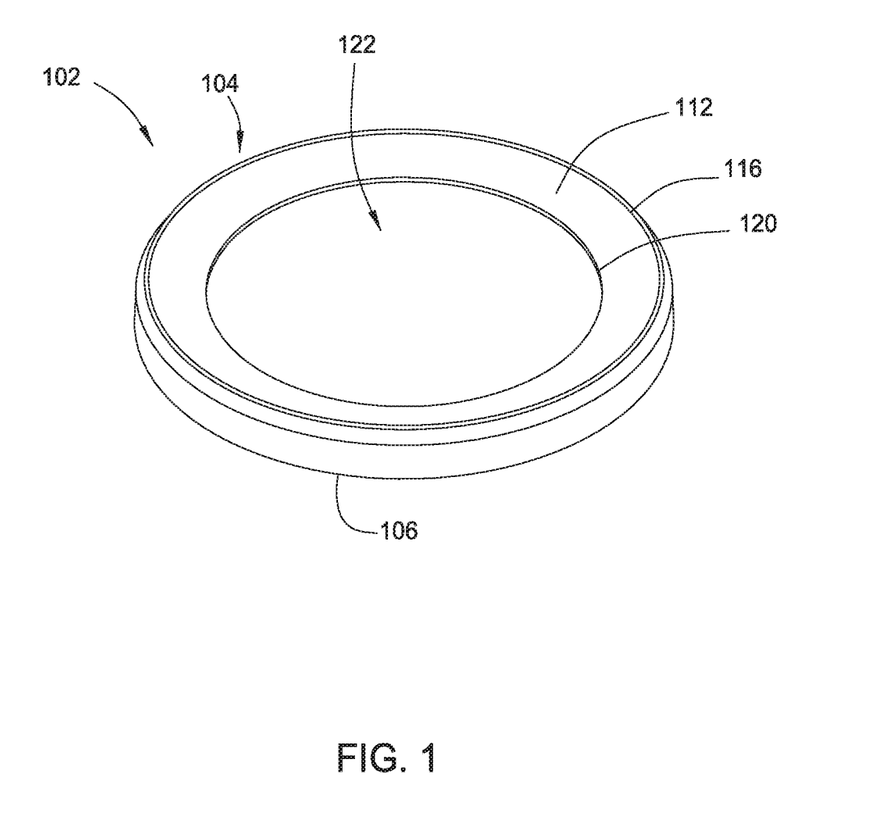
FIG. 1 depicts a top perspective view of a substrate process component for a processing chamber according to one embodiment.
Figure 2:
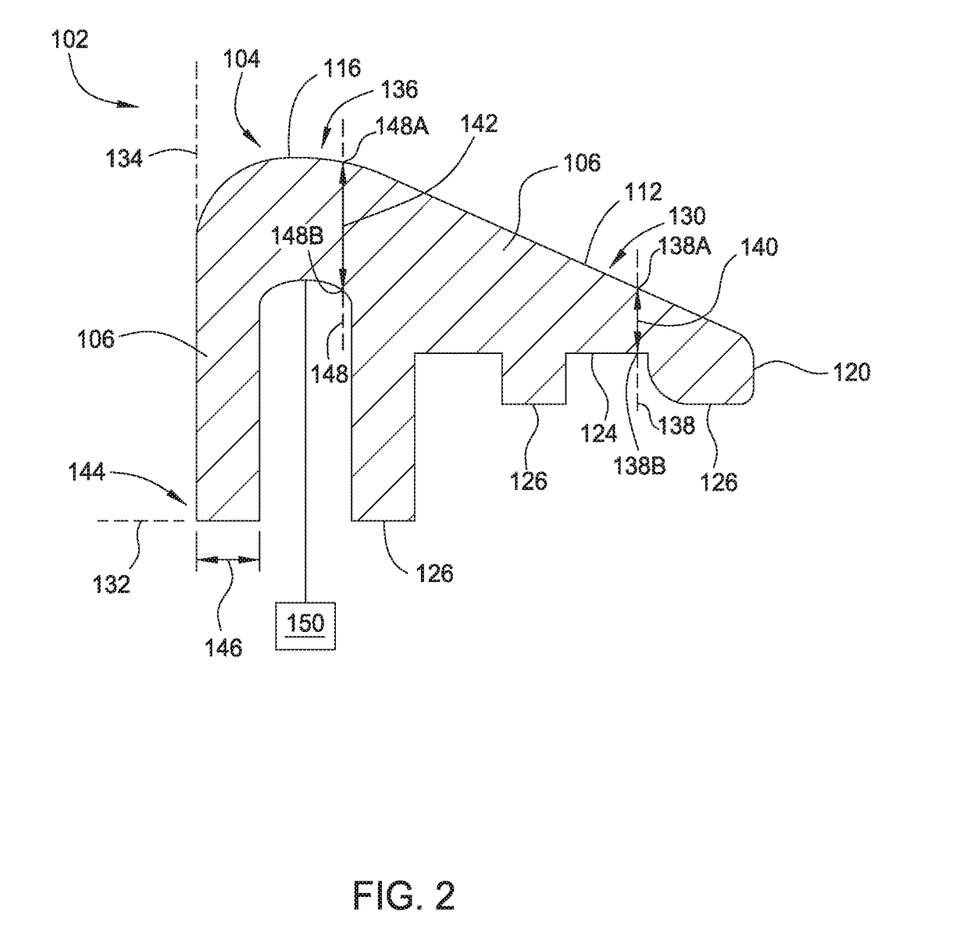
FIG. 2 depicts a front schematic sectional view of a substrate process component for a processing chamber according to one embodiment.

FIG. 1 and FIG. 2 illustrate a top perspective view and a sectional view, respectively, of a substrate process component 102 according to embodiments. In the embodiment shown, the substrate process component 102 is embodied as a cover ring that can be used in a PVD or CVD processing chamber to protect the processing chamber from deposition materials. More specifically, the cover ring protects a substrate support used to support a substrate in a process region of the processing chamber. The substrate process component 102 may also be embodied as other substrate process components including, but not limited to, shields, coils, pedestals, shutters, collimators, deposition rings, cover rings, clamp rings, and showerheads, among other components.

For the embodiment shown in FIG. 1, substrate process component 102 has a component body 104 having a cylindrical shape. The component body 104 has a side wall 106.

The side wall 106 has an outer surface 112 facing outward from the component body 104. In some embodiments, the outer surface 112 has one or more coating layers disposed on the outer surface 112. For example, a thermal spray such as twin arc sprayed (TWAS) aluminum may be applied on the outer surface 112. The outer surface 112 is a surface of the component body 104 on which deposit materials form when the substrate process component 102 is used in the processing chamber. The side wall 106 tapers downwardly from a ring section 116 to a ring inner perimeter 120. The ring inner perimeter 120 defines a top opening 122 in the component body 104.

Referring to FIG. 1B, the component body 104 further includes a bottom surface 124 extending along the underside of the component body 104. Extending from the bottom surface 124 are support legs 126 used to support the substrate process component 102 in position in the processing chamber. The component body 104 has reference dimensions that define the shape of the component body 104 of the substrate process component 102. The reference dimensions may correspond to pre-defined wall thicknesses of the side wall 106 at specific points on the outer surface 112. The reference dimensions for the substrate process component 102 may be the original design manufacturing dimensions of the substrate process component 102. In some embodiments, the reference dimensions correspond to the dimensions of a substrate process component 102 before use in a processing chamber.

The reference dimensions may be located on the component body 104 using selected coordinate systems or other conventional methods. An x-axis 132 and y-axis 134 may be used to identify reference points on the outer surface 112. The y-axis 134 is perpendicular to the x-axis 132 and extends in a location adjacent the ring section 116 and along the outer surface 112. The reference dimensions may further have a tolerance. The tolerance provides a reference tolerance range in which the reference dimension is considered acceptable. In some embodiments, the reference tolerance range is defined for the substrate process component 102 and remains the same for a plurality of recycle iterations, and is referred to as a pre-defined reference tolerance range. For example, a side wall 106 that has a wall thickness that falls within the reference dimension range would be considered to meet the first reference dimension. The component body 104 may have a first reference dimension, second reference dimension, third reference dimension, and fourth reference dimension. For example, the first reference dimension has a first reference tolerance range, and the second reference dimension has a second reference tolerance range. The reference dimensions may each have a pre-defined reference tolerance range, including a first pre-defined reference tolerance range and a second pre-defined reference tolerance range.

In some embodiments, the first pre-defined wall thickness 140 is smaller than the second pre-defined wall thickness 142 for the outer surface 112. The first pre-defined wall thickness 140 may have a tolerance range that is smaller than the tolerance range for the second pre-defined wall thickness 142. The larger tolerance range for the second pre-defined wall thickness 142 may be provided to account for the added structural strength provided by the larger thickness of the second pre-defined wall thickness 142.

In some embodiments, the side wall 106 has a first pre-defined wall thickness 140 in a first component region 130 located in an area on the outer surface 112. The first pre-defined wall thickness 140 is the distance between the outer surface 112 and the bottom surface 124 along a first line 138 that is parallel to the y-axis 134. The first pre-defined wall thickness 140 may be measured between a selected first outer reference point 138A on the outer surface 112 in the first component region 130 and a selected first bottom reference point 138B. The first reference dimension corresponds to the first pre-defined wall thickness 140, and in some embodiments is equal to the first pre-defined wall thickness 140. A second pre-defined wall thickness 142 is the distance between the outer surface 112 and the bottom surface 124 along a second line 148 parallel to the y-axis 134. The second pre-defined wall thickness 142 may be measured between a different selected second outer reference point 148A on the outer surface 112 in a second component region 136 and a selected second bottom reference point 148B. The second reference dimension corresponds to the second pre-defined wall thickness 142, and in some embodiments is equal to the second pre-defined wall thickness 142. There may be a plurality of pre-defined wall thicknesses at different locations on the outer surface 112.

As shown in FIG. 2, the first pre-defined wall thickness 140 is different from the second pre-defined wall thickness 142. More specifically, the first pre-defined wall thickness 140 is smaller than that second pre-defined wall thickness 142. The outer surface 112 has a third pre-defined wall thickness 146 in a third component region 144 located at an area on the outer surface 112. The third pre-defined wall thickness 146 is the distance between the outer surface 112 and the bottom surface 124 along the x-axis 132. The third pre-defined wall thickness 146 is at a selected reference point on the outer surface 112 in the third component region 144.

In some embodiments, the substrate process component 102 may be identified with an identification marking 150, schematically shown in FIG. 2. The identification marking 150 may be an identification number. The identification marking 150 may be disposed on the bottom surface 124 of the component body 104. The identification marking 150 provides a unique identifier for the substrate process component 102 and is used to keep track of a recycle iteration number used to track the number of times that the substrate process component 102 has been through a recycle process, as discussed below.

Figure 3:
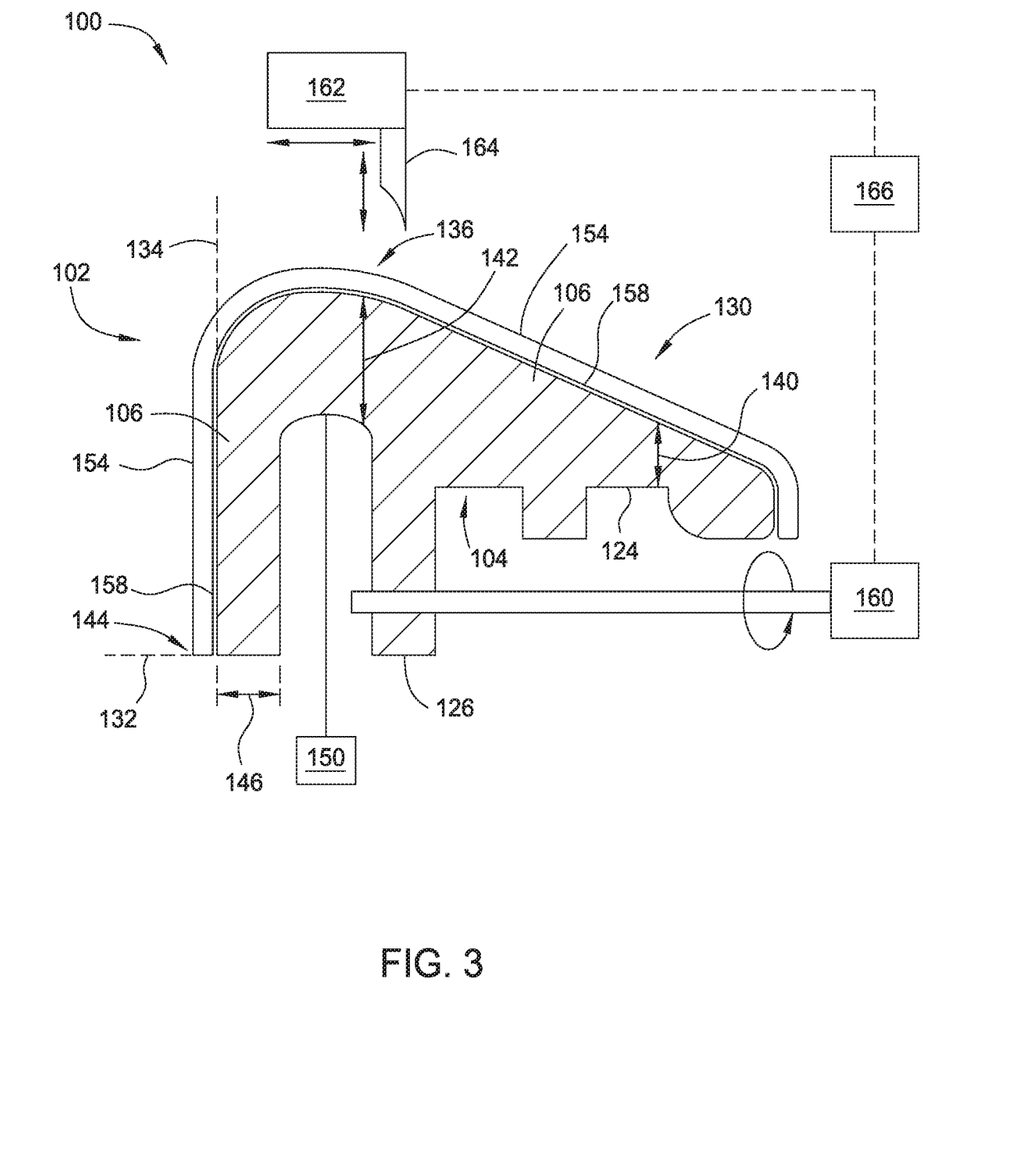
FIG. 3 depicts a recycling system for a substrate process component according to one embodiment.

Referring to FIG. 3, a schematic view of a recycling system 100 for the substrate process component 102 is shown according to embodiments. The substrate process component 102 is shown in schematic cross-section and is shown to have deposition materials on the component body 104 from use in the processing chamber. The component body 104 has a residue layer 154 on the outer surface 112. In the embodiment shown in FIG. 3, the component body 104 has a coating layer 158 formed on the outer surface 112 and the coating layer 158 is disposed between the outer surface 112 and the residue layer 154. In other embodiments, the component body 104 does not have a coating layer 158. The thickness of the residue layer 154 is exaggerated in FIG. 2 for illustration purposes. The residue layer 154 includes deposition materials deposited onto the outer surface 112 during use of the substrate process component 102 in a processing chamber.

The bottom surface 124 opposes the outer surface 112 of the side wall 106. The bottom surface 124 is protected from the deposition materials in the processing chamber due to being on the opposing surface of the side wall 106 opposite the outer surface 112. In other words, the outer surface 112 faces the processing region of the processing chamber such that deposition materials may be deposited thereon, while the bottom surface 124 faces away from the processing region of the processing chamber such that deposition materials do not deposit thereon. In some embodiments, a small amount of deposition material may deposit on the bottom surface 124 of the component body 104 relative to the amount of deposition materials deposited on the outer surface 112.

The recycling system 100 includes a work piece holder 160, machining tool 162 having a mechanical cutting tool 164, and a controller 166. The recycling system 100 is used in the recycling process of the substrate process component 102. The recycling process includes removing the residue layer 154 from the outer surface 112 of the component body 104. The controller 166 of the recycling system 100 is coupled to the work piece holder 160 and machining tool 162 to provide control of the machining of the substrate process component 102. The controller 166 includes a memory, processor, and input/out (I/O) device. The reference dimensions for the substrate process component 102 are stored in the memory of the controller 166. The processor of the controller 166 may retrieve the stored reference dimensions during a machining operation. The reference dimensions stored in controller 166 may include the pre-defined wall thicknesses 140, 142, 146. The controller 166 controls the work piece holder 160 and machining tool 162 using the reference dimensions to remove the residue layer 154 from the outer surface 112.

The machining of the outer surface 112 includes using the work piece holder 160 to secure the substrate process component 102. The work piece holder 160 is schematically shown clamping one of the support legs 126 of the substrate process component 102. In other embodiments, the work piece holder 160 may hold the component body 104 from other locations of the component body 104. In the embodiment shown, the work piece holder 160 is configured to move the substrate process component 102. In other embodiments, the work piece holder 160 holds the substrate process component 102 stationary and the mechanical cutting tool 164 moves relative to the substrate process component 102 to remove the residue layer 154.

The controller 166 controls the parameters of the work piece holder 160 and mechanical cutting tool 164, including the speed of revolution and feed of the substrate process component 102 relative to the mechanical cutting tool 164. The machining tool 162 and mechanical cutting tool 164 are schematically shown and positioned above the outer surface 112. The machining tool 162 and mechanical cutting tool 164 may be selected to have a cutting tolerance that is substantially less than the tolerance ranges for the pre-defined wall thicknesses 140, 142, 146. In some embodiments, the machining tool 162 and mechanical cutting tool 164 may be selected to have a cutting tolerance that is between 0.001 inches (0.0254 mm) and 0.010 inches (0.2540 mm), or 0.002 (0.0508 mm) and 0.005 inches (0.127 mm). The cutting tolerances are relative to an optimal cutting point of the mechanical cutting tool 164. The machining tool 162 may be movable in a plurality of directions.

The controller 166 controls the machining tool 162 to pass the mechanical cutting tool 164 across the outer surface 112 in a machining operation. In some embodiments, the process for recycling the substrate process component 102 includes applying a cutting fluid to the substrate process component 102 during the passing of the mechanical cutting tool 164 across the outer surface 112. In some embodiments, the mechanical cutting tool 164 makes a plurality of passes across the outer surface 112 during the machining operation to remove the residue layer 154. In some embodiments, the number of passes of the mechanical cutting tool 164 across first component region 130 and the second component region 136 of the outer surface 112 may depend on the tolerance ranges for the first reference dimension for the first component region 130 and the second reference dimension for the second component region 136.

For embodiments of the substrate process components 102 having a coating layer 158, the mechanical cutting tool 164 may also remove the coating layer 158 disposed beneath the residue layer 154 during the machining operation. In some embodiments, the thickness of the coating layer 158 is minimal and falls within the tolerance ranges of the reference dimensions. In some embodiments, at least a portion of the coating layer 158 may remain on the outer surface 112.

The controller 166 uses the reference dimensions of the component body 104 to control the machining operation to remove the residue layer 154 and maintain the reference dimensions for the substrate process component 102. Because the controller 166 uses the reference dimensions for the component body 104 to control the machining tool 162, the machining tool 162 removes the residue layer 154 while substantially preventing degradation of the outer surface 112 so that the residue layer 154 is removed while the thickness of the side wall 106 is maintained within the reference dimensions for the component body 104. The machining tool 162 may be precisely controlled by using the reference dimensions to minimize degradation of the outer surface 112 so that any degradation of the outer surface 112 falls within the tolerance ranges for the pre-defined wall thicknesses 140-146.

After the machining operation and removal of the residue layer 154, the side wall 106 has the first reference dimension in the first component region 130 and has the second reference dimension in the second component region 136. In addition, machining with the machining tool 162 allows for the selection of surfaces on the component body 104 to be machined, and different mechanical cutting tools 164 may be selected for machining different component regions 130, 136, 144. For example, the bottom surface 124 of the side wall 106 would not be machined and the bottom surface 124 would not be degraded.

In the machining operation, the controller 166 controls the depth of the cut by the mechanical cutting tool 164 through the residue layer 154. The machining operation uses computer numeric control (CNC) machining to control the machining operation. One benefit of using the reference dimensions corresponding to pre-defined wall thicknesses 140, 142, 146 is that the depth of the cut by the mechanical cutting tools 164 may be precisely controlled by the reference dimensions for the component body 104. The reference dimensions correspond to pre-defined wall thicknesses 140, 142, 146 that are selected prior to the substrate process component 102 being used in the processing chamber. The reference dimensions are used to precisely control the depth of the cut to limit removing material from the outer surface 112 during the recycling process. The machining tool 162 is directed by the controller 166 to remove the residue layer 154 on the outer surface 112. Removal of material from the outer surface 112 will be substantially prevented and the thickness of the side wall 106 for the outer surface 112 will be maintained after the machining operation. After the recycling process, the thicknesses of the side wall 106 will fall within the reference dimensions.

Figure 4:
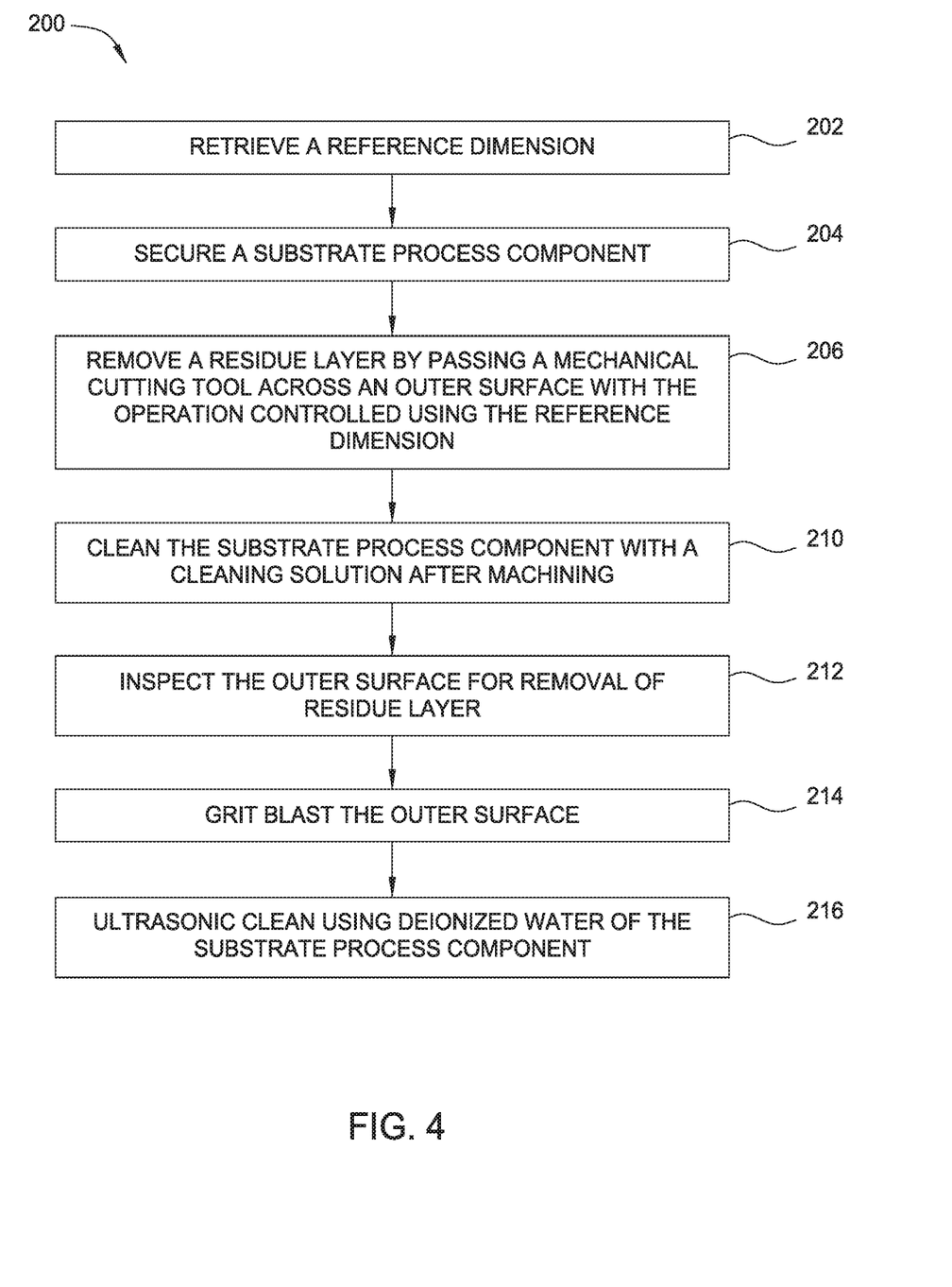
FIG. 4 depicts a flow chart of a recycling process for a substrate process component according to one embodiment.

Referring to FIG. 4, a flow chart of an example recycling process 200 for recycling the substrate process component 102 according to some embodiments is shown. FIG. 4 shows steps that can be performed by the recycling system 100. A reference dimension is retrieved (202) for the substrate process component 102. The reference dimension may correspond to a first pre-defined wall thickness 140 of the substrate process component 102. The reference dimension may be stored in the memory and retrieved by the processor of the controller 166. The substrate process component 102 is secured (204) to a work piece holder 160 for controlling the movement of the substrate process component 102 during the recycling process 200. The residue layer 154 is removed (206) by passing a mechanical cutting tool 164 across an outer surface 112 with the operation controlled using the reference dimension. A coolant may be applied to the substrate process component 102 during the machining process. The side wall 106 of the substrate process component 102 maintains the reference dimension after the removal of the residue layer 154.

A cleaning solution cleans (210) the substrate process component 102 after the machining operation to remove the residue layer 154. The cleaning solution includes soap. The outer surface 112 is inspected (212) for removal of the residue layer 154. An additional machining operation may be performed to remove portions of the residue layer 154 on the outer surface 112 detected in the inspection, while maintaining the thickness of the side wall 106 within the pre-defined wall thicknesses 140, 142, 146.

The outer surface 112 is grit blasted (214) after application of the cleaning solution. Grit blasting is used to establish the roughness of the outer surface 112. The grit blasting may also remove at least a portion or all of any portion of the coating layer 158 that remains after the machining operation. After grit blasting, ultrasonic clean process (216) using deionized water is used to clean the substrate process component 102. The water clean operation may use deionized water. After the water clean operation, the substrate process component 102 can be dried and packaged. In some embodiments, a recycle coating layer may be applied on the outer surface 112 after the substrate process component 102 is dried and prior to packaging. The recycle coating layer added may be a thermal spray such as twin arc sprayed (TWAS) aluminum applied to the outer surface 112. The substrate process component 102 would then have completed the recycle process and be ready for another use in the processing chamber.

The recycle process includes a use in one or more processing chambers and a recycling of the outer surface 112. There may be a plurality of recycle iterations, including performing a first recycle iteration and a second recycle iteration. For example, a first recycle iteration would include use of a substrate process component 102 in the processing chamber and then recycling of the substrate process component 102 for the first time, including machining the outer surface 112. The controller 166 would use at least one of the reference dimensions to control the machining operation to remove the residue layer 154.

The second recycle iteration would include using the substrate process component 102 that has been recycled in the first recycle iteration in a processing chamber and then recycling the substrate process component 102 including machining the outer surface 112. This recycle process may be repeated a multiple number of times to increase the service life of the substrate process component 102. The identification marking 150 on the substrate process component 102 is used to track the number of recycle iterations in which the substrate process component 102 has been machined (i.e., recycled), and is referred to as the recycle iteration number. The recycle iteration number corresponds to the number of recycle iterations. In some embodiments, the identification marking 150 and the recycle iteration number for the substrate process component 102 is loaded and stored in the controller 166. There may be a plurality of substrate process components 102 that have identification markings 150 and recycle iteration numbers stored in the controller 166.

For the second recycle iteration, a compensation factor is determined that corresponds to a decrease in the pre-defined wall thickness due to the at least one previous recycle iteration. For example, there may be a small decrease in the wall thickness of side wall 106 after the outer surface 112 is machined during the first recycle iteration of the substrate process component 102. The small decrease in the wall thickness may be measured after the machining operation of the first recycle iteration. In some embodiments, the small decrease in the wall thickness may be determined empirically or experimentally based on factors from the machining operation, grit blasting, and other cleaning processes in a recycle iteration. For example, empirically derived erosion profiles may be developed based on the grit blasting operations used during a recycle iteration. The compensation factor corresponds to this small decrease in the wall thickness in the first component region 130. The reference dimension with the compensation factor may be used to control the machining operation to remove the residue layer 154, while reducing the material removed from the outer surface 112. For example, the compensation factor may be subtracted from the first pre-defined wall thickness 140 to provide adjustment of the first reference dimension when using the first reference dimension with the compensation factor. For a third recycle iteration, the compensation factor may be doubled to account for the two previous recycle iterations. The compensation factor may be additive for other subsequent recycle iterations.

The compensation factor and recycle iteration number is used by the controller 166 for the second recycle iteration of the substrate process component 102 to keep track of the recycle iteration for the substrate process component 102. The reference dimensions, compensation factor, the identification marking 150, and the recycle iteration number for the substrate process component 102 may be stored in the controller 166. The storing of the identification marking 150 and the recycle iteration number in the controller 166 enables the controller 166 to identify the number of times that the substrate process component 102 has been recycled and to use the recycle iteration number in the controller 166 to control the machining operation to remove the residue layer 154. The machining operation varies for the plurality of recycle iterations depending on the recycle iteration number for the substrate process component 102.

The small decrease in the first component region 130 of the side wall 106 after each recycling process may be less than the tolerance range of the first reference dimension. These small decreases in the side wall 106 in the first component region 130 may be additive over multiple recycle processes. The compensation factor may be adjusted so that the additive decreases in the side wall 106 for the previous recycle iterations are combined in the compensation factor used for the third recycle iteration and subsequent recycle iterations. The compensation factor allows the machining process to remain precise after multiple recycle processes so that the residue layer 154 is removed for each of multiple recycle processes. The substrate process component 102 can go through multiple recycle processes before the thickness of the side wall 106 in the first component region 130 falls outside of the first reference dimension range of the first reference dimension.

Maintaining the reference dimensions for the side wall 106 after the recycling process results in a substrate process component 102 that may be recycled and used within the processing chamber after the recycling process. One benefit of embodiments disclosed is that the machining operation of the substrate process component 102 results in machined chips from the outer surface 112. These machined chips are made from metallic compounds and may be recycled. Another benefit is that use of the reference dimensions to control the machining operation may eliminate the need to make some measurements of the component body 104 for each substrate process component 102 that needs recycling after use in the processing chamber. Limiting the customized measurements needed for an individual substrate process component 102 may also reduce the cost of and improve the consistency of the recycle process.

While the foregoing is directed to embodiments of the present disclosure, other and further embodiments of the disclosure may be devised without departing from the basic scope thereof, and the scope thereof is determined by the claims that follow.

The invention claimed is:

1. A process for recycling substrate process component of a processing chamber, comprising:
retrieving a reference dimension of the substrate process component that corresponds to a dimension of the substrate process component before the substrate process component is used in the processing chamber, wherein the substrate process component comprises a side wall having a bottom surface, an outer surface, and a pre-defined wall thickness between the bottom surface and the outer surface, and wherein the reference dimension further corresponds to the pre-defined all thickness;
retrieving a compensation factor for the side wall that corresponds to a decrease in the pre-defined wall thickness during a prior recycling operation of the substrate process component; and
machining the substrate process component with a mechanical cutting tool to remove a residue layer formed during use of the substrate process component in the processing chamber, wherein the machining comprises:
securing the substrate process component to a work piece holder; and
passing the mechanical cutting tool across the outer surface in a machining operation controlled by a controller to remove the residue layer, wherein the controller uses the reference dimension and the compensation factor to control the machining operation.

2. The process for recycling the substrate process component of claim 1, further comprising:
storing a recycle iteration number in the controller to identify a number of times that the substrate process component has been recycled; and
using the recycle iteration number in the controller to control the machining operation to remove the residue layer.

3. The process for recycling the substrate process component of claim 1, wherein the reference dimension comprises a pre-defined reference tolerance range.

4. The process for recycling the substrate process component of claim 1, further comprising:
applying a cutting fluid to the substrate process component during the passing of the mechanical cutting tool across the outer surface;

cleaning the substrate process component with a cleaning solution after machining.

5. The process for recycling the substrate process component of claim 1, wherein the substrate process component comprises a coating layer on the outer surface, wherein the machining removes at least a portion of the coating layer.

6. The process for recycling the substrate process component of claim 1, wherein the process for recycling the substrate process component further comprises applying a recycle coating layer on the outer surface after machining.

7. A process for recycling a substrate process component of a processing chamber, comprising:
  retrieving a first reference dimension of the substrate process component in a first component region that corresponds to a first dimension of the substrate process component before the substrate process component is used in the processing chamber, wherein the substrate process component comprises a side wall having bottom surface, an outer surface, and a first pre-defined wall thickness between the bottom surface and the outer surface in the first component region, and wherein the first reference dimension further corresponds to the first pre-defined wall thickness;
  retrieving a first compensation factor for the side wall that corresponds to a decrease in the first pre-defined wall thickness during a prior recycling operation of the substrate process component; and
  machining the substrate process component with a mechanical cutting tool to remove a residue layer in the first component region from thae outer surface, wherein the machining comprises:
    securing the substrate process component to a work piece holde and
    passing the mechanical cutting tool across the outer surface in a machining operation controlled by a controller to remove the residue layer in the first component region, wherein the controller uses the first reference dimension and the first compensation factor to control the machining operation to remove the residue layer in the first component region.

8. The process for recycling the substrate process component of claim 7, wherein the first reference dimension comprises a first pre-defined reference tolerance range.

9. The process for recycling the substrate process component of claim 7, further comprising:
  retrieving a second reference dimension of the substrate process component in a second component region that corresponds to a second dimension of the substrate process component before the substrate process component is used in the processing chamber, wherein the substrate process component comprises a second pre-defined wall thickness between the bottom surface and the outer surface in a second component region of the outer surface, and wherein the second reference dimension further corresponds to the second pre-defined wall thickness;
  retrieving a second compensation factor for the side wall that corresponds to a decrease in the second pre-defined wall thickness during a prior recycling operation of the substrate process component;
  wherein the controller uses the second reference dimension and the second compensation factor to control the machining operation to remove the residue layer in the second component region.

10. The process for recycling the substrate process component of claim 7, further comprising:
  applying a coolant to the substrate process component during the passing of the mechanical cutting tool across the outer surface;
  cleaning the substrate process component with a cleaning solution; and
  grit blasting the outer surface after cleaning with the cleaning solution.

11. The process of recycling the substrate process component of claim 7, wherein the substrate process component comprises a coating layer on the outer surface, and wherein the machining removes at least a portion of the coating layer.

12. The process for recycling the substrate process component of claim 11, further comprising:
  applying a coating layer on the outer surface after machining.

13. The process for recycling the substrate process component of claim 9, wherein the first reference dimension is different from the second reference dimension.

14. A process for recycling a substrate process component of a processing chamber, comprising:
  retrieving a first reference dimension of the substrate process component in a first component region that corresponds to a first dimension of the substrate process component before the substrate process component is used in the processing, chamber, wherein the substrate process component comprises a side wall having a bottom surface, an outer surface, and a first pre-defined wall thickness between the bottom surface and the outer surface in the first component region, and wherein the first reference dimension further corresponds to the first pre-defined wall thickness;
  retrieving a first compensation factor for the side wall corresponding to a decrease in the first pre-defined wall thickness during a prior recycle operation of the substrate process component;
  retrieving a second reference dimension of the substrate process component in a second component region that corresponds to a second dimension of the substrate process component before the substrate process component is used in the processing chamber wherein the substrate process component comprises a second pre-defined wall thickness between the bottom surface and the outer surface in the second component region of the outer surface, and wherein the second reference dimension further corresponds to the second pre-defined wall thickness;
  retrieving a second compensation factor for the side wall that corresponds to a decrease in the second pre-defined wall thickness during a prior recycling operation of the substrate process component; and
  machining the substrate process component with a mechanical cutting tool to remove a first residue layer from the outer surface in a recycle operation, wherein the machining comprises:
    securing the substrate process component to a work, piece holder; and
    passing the mechanical cutting tool across the outer surface in a machining operation controlled by a controller, wherein the controller uses the first reference dimension and the first compensation factor in controlling the machining operation to remove the first residue layer in the first component region and the second reference dimension and the second compensation factor to control the machining operation to remove the first residue layer in the second component region.

15. The process for recycling the substrate process component of claim 14, wherein the first reference dimension comprises a first pre-defined reference tolerance range.

16. The process for recycling the substrate process component of claim 14, wherein the process for recycling the substrate process component comprises a plurality of recycle iterations, wherein the substrate process component comprises an identification marking, wherein the machining operation varies for the plurality of recycle iterations depending on a recycle iteration number for the substrate process component, and wherein the recycle iteration number corresponds to a number of recycle iterations.

17. The process for recycling the substrate process component of claim 15, wherein the first reference dimension comprises a first reference tolerance range for the first component region and a second reference tolerance range for the second component region, and wherein the first reference tolerance range and the second reference tolerance range are different.

* * * * *